(12) United States Patent
Yan et al.

(10) Patent No.: US 9,812,558 B2
(45) Date of Patent: Nov. 7, 2017

(54) THREE-DIMENSIONAL TRANSISTOR AND METHODS OF MANUFACTURING THEREOF

(71) Applicants: Taiwan Semiconductor Manufacturing Company, Ltd., Hsinchu (TW); National Taiwan University, Taipei (TW)

(72) Inventors: Jhih-Yang Yan, Taipei (TW); Samuel C. Pan, Hsinchu (TW); Chee Wee Liu, Hsinchu (TW); Hung-Yu Yeh, Taichung (TW); Da-Zhi Zhang, New Taipei (TW)

(73) Assignees: National Taiwan University, Taipei (TW); Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 15/466,656

(22) Filed: Mar. 22, 2017

(65) Prior Publication Data
US 2017/0194464 A1    Jul. 6, 2017

Related U.S. Application Data

(62) Division of application No. 14/732,224, filed on Jun. 5, 2015, now Pat. No. 9,627,411.

(51) Int. Cl.
*H01L 21/00* (2006.01)
*H01L 29/66* (2006.01)
(Continued)

(52) U.S. Cl.
CPC .. *H01L 29/66795* (2013.01); *H01L 21/26513* (2013.01); *H01L 21/30604* (2013.01);
(Continued)

(58) Field of Classification Search
CPC ............. H01L 29/66795; H01L 29/785; H01L 29/66545; H01L 29/7848;
(Continued)

(56) References Cited

U.S. PATENT DOCUMENTS 8,448,100 B1  5/2013  Lin et al.
8,631,372 B2  1/2014  Yu et al.
(Continued)

OTHER PUBLICATIONS

Kedzierski, Jakub, et al., "High-performance symmetric-gate and CMOS-compatible V1 asymmetric-gate FinFET devices," Electron Devices Meeting 2001, IEDM '01, Technical Digest International, Dec. 2-5, 2001, 4 pages.
(Continued)

*Primary Examiner* — Jaehwan Oh
(74) *Attorney, Agent, or Firm* — Slater Matsil, LLP

(57) ABSTRACT

A method includes providing a substrate having a mesa, forming a first opening in the mesa, the first opening being surrounded by first inner sidewalls of the mesa exposed by the first opening. The method further includes etching from a first one of the first inner sidewalls of the mesa to form a first vertical recess, the first vertical recess having a wide end and a narrow end, with the narrow end defining a first vertically recessed channel region, and forming a first gate structure over the first vertically recessed channel region.

20 Claims, 15 Drawing Sheets

(51) Int. Cl.
*H01L 27/12* (2006.01)
*H01L 21/8234* (2006.01)
*H01L 21/84* (2006.01)
*H01L 27/088* (2006.01)
*H01L 29/08* (2006.01)
*H01L 21/306* (2006.01)
*H01L 21/265* (2006.01)

(52) U.S. Cl.
CPC ........ *H01L 21/823412* (2013.01); *H01L 21/823418* (2013.01); *H01L 21/823431* (2013.01); *H01L 21/845* (2013.01); *H01L 27/0886* (2013.01); *H01L 27/1211* (2013.01); *H01L 29/0847* (2013.01); *H01L 29/66545* (2013.01)

(58) Field of Classification Search
CPC ....... H01L 21/823431; H01L 27/0886; H01L 21/823821; H01L 27/0924; H01L 29/165; H01L 21/845; H01L 27/1211; H01L 29/7851; H01L 21/76224
See application file for complete search history.

(56) References Cited

U.S. PATENT DOCUMENTS

| | | | |
|---|---|---|---|
| 8,669,780 B2 | 3/2014 | Chi | |
| 8,701,073 B1 | 4/2014 | Fu et al. | |
| 8,754,818 B2 | 6/2014 | Yen et al. | |
| 2004/0195624 A1* | 10/2004 | Liu | H01L 21/84 257/347 |
| 2004/0219722 A1* | 11/2004 | Pham | H01L 29/785 438/157 |
| 2005/0156202 A1* | 7/2005 | Rhee | H01L 29/7853 257/213 |
| 2005/0239254 A1* | 10/2005 | Chi | H01L 29/7853 438/270 |
| 2008/0230824 A1* | 9/2008 | Doornbos | H01L 21/28273 257/315 |
| 2010/0155843 A1* | 6/2010 | Mayer | H01L 29/41791 257/347 |
| 2013/0193981 A1 | 8/2013 | Chen et al. | |
| 2013/0246990 A1 | 9/2013 | Yen et al. | |
| 2013/0320553 A1 | 12/2013 | Kuo et al. | |
| 2014/0043148 A1 | 2/2014 | Wang et al. | |
| 2014/0077057 A1 | 3/2014 | Chao et al. | |
| 2014/0092939 A1 | 4/2014 | Chang et al. | |
| 2014/0126089 A1 | 5/2014 | Chang et al. | |
| 2014/0126274 A1 | 5/2014 | Lee et al. | |
| 2014/0134814 A1* | 5/2014 | Wong | H01L 21/82341 438/283 |
| 2014/0167799 A1 | 6/2014 | Wang et al. | |
| 2014/0195728 A1 | 7/2014 | Hsu et al. | |
| 2014/0203397 A1 | 7/2014 | Yen et al. | |
| 2014/0211438 A1 | 7/2014 | Lin et al. | |
| 2014/0239427 A1 | 8/2014 | Huang et al. | |
| 2014/0264772 A1 | 9/2014 | Horng et al. | |
| 2014/0266273 A1 | 9/2014 | Wang et al. | |

OTHER PUBLICATIONS

Vega, Reinaldo A., et al., "A Comparative Study of Dopant-Segregated Schottky and Raised Source/Drain Double-Gate MOSFETs," IEEE Transactions on Electron Devices, vol. 55, No. 10, Oct. 2008, pp. 2665-2677.

Wu, Heng, et al., "Ge CMOS: Breakthroughs of nFETs (Imax=714 mA/mm, gmax=590 mS/mm) by Recessed channel and S/D," 2014 Symposium on VLSI Technology Digest of Technical Papers, Jun. 9-12, 2014, 2 pages.

Wu, Heng, et al., "Deep Sub-100 nm Ge CMOS Devices on Si with the Recessed S/D and Channel," Electron Devices Meeting, IEDM 2014, IEEE INternational, Dec. 15-17, 2014, 4 pages.

* cited by examiner

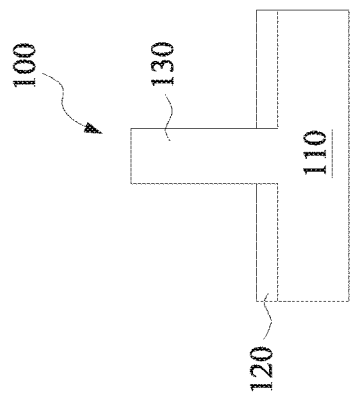
Fig. 1a
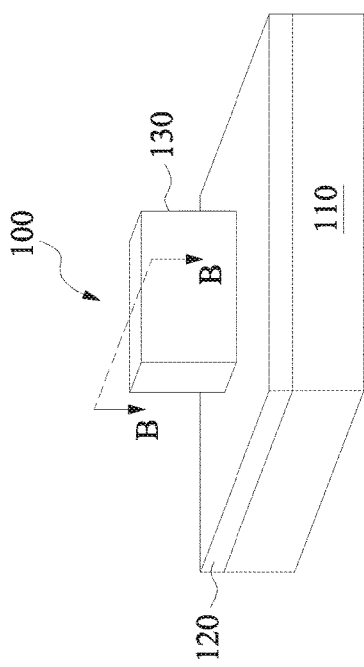
Fig. 1b
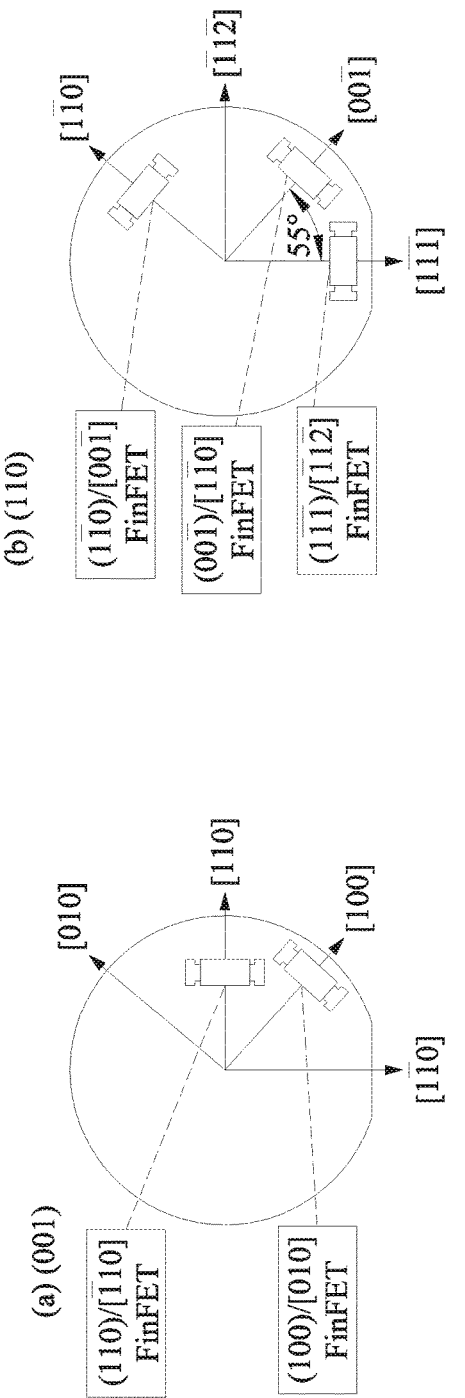
Fig. 2a
Fig. 2b

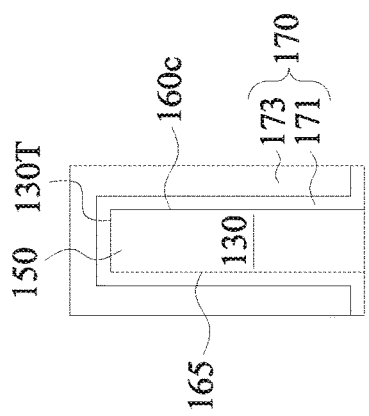
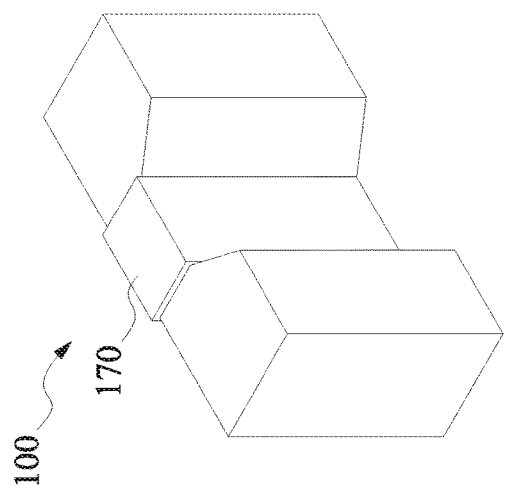
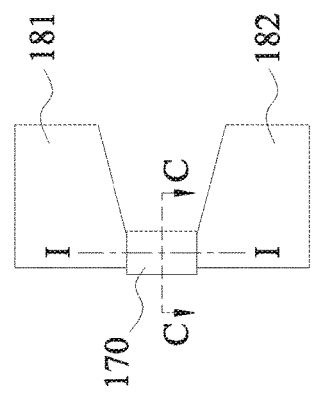

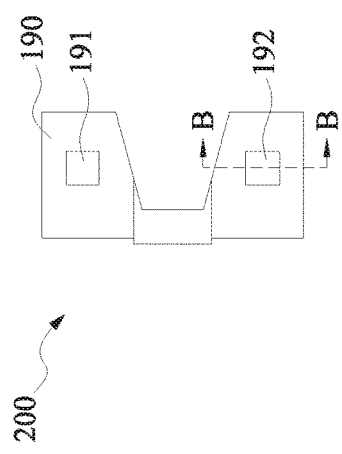
Fig. 14a
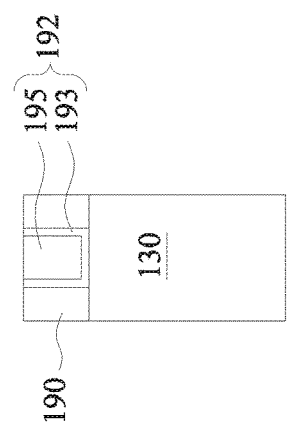
Fig. 14b
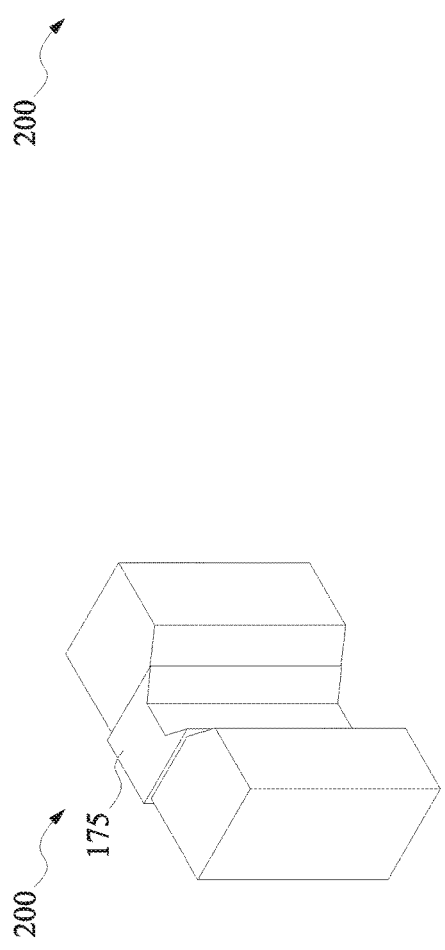
Fig. 13a
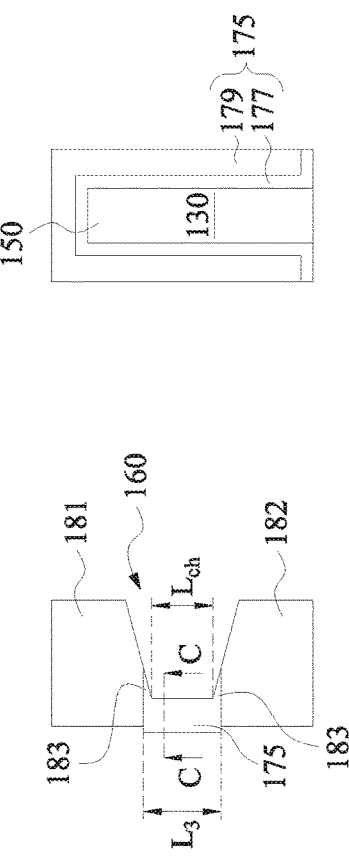
Fig. 13c
Fig. 13b

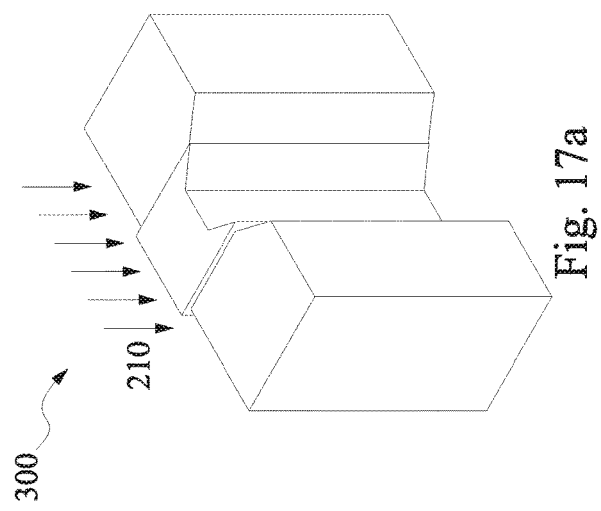
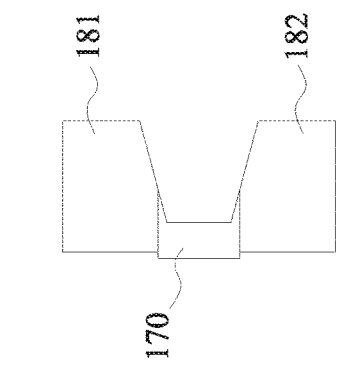
Fig. 16a
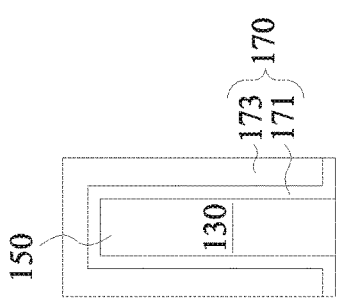
Fig. 16b
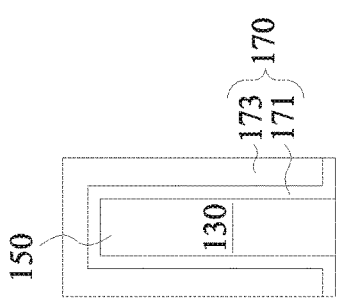
Fig. 16c
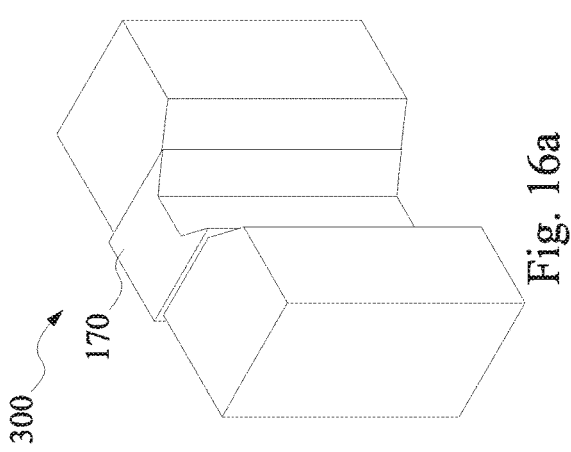
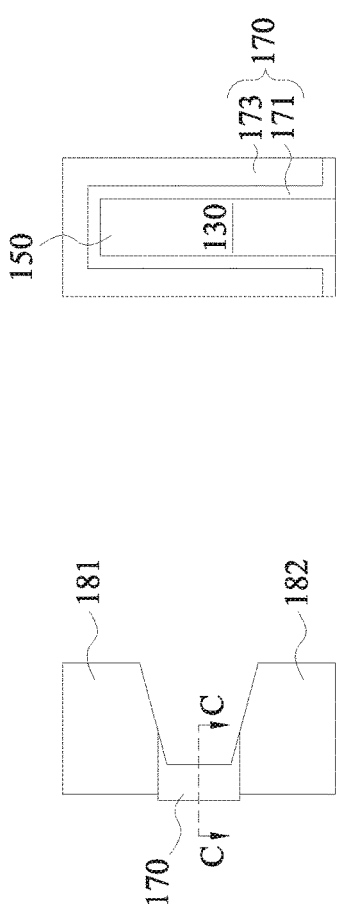
Fig. 17a
Fig. 17b

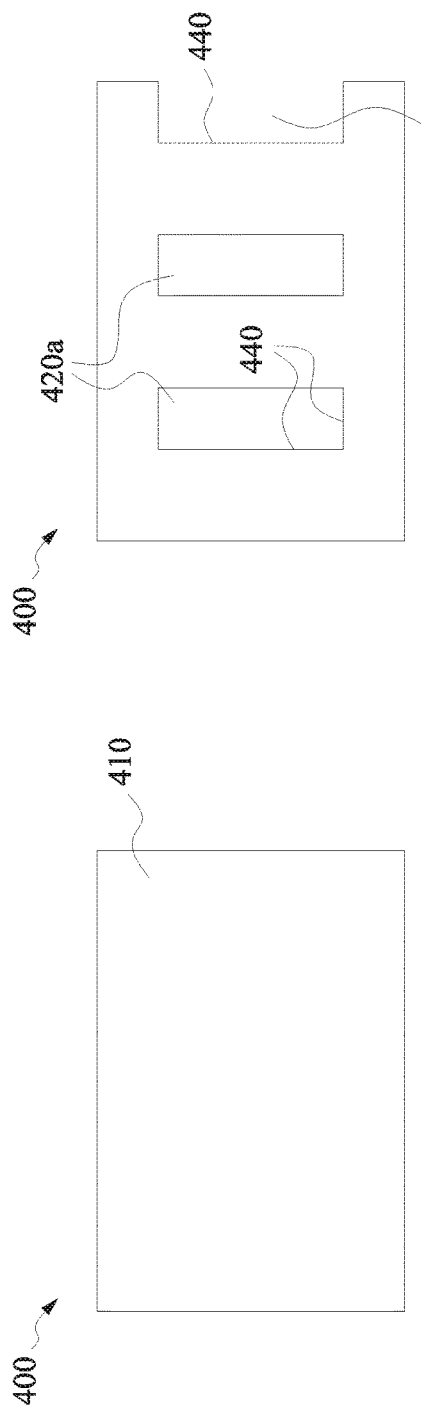
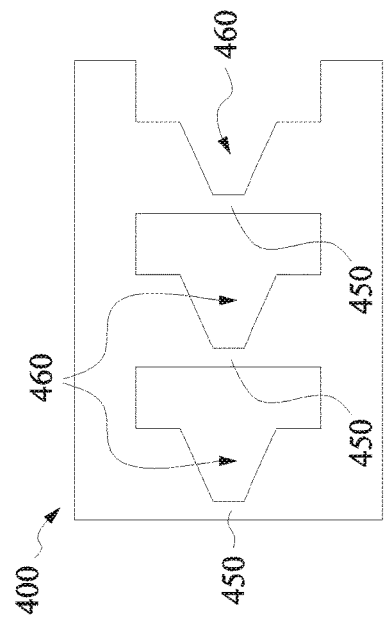
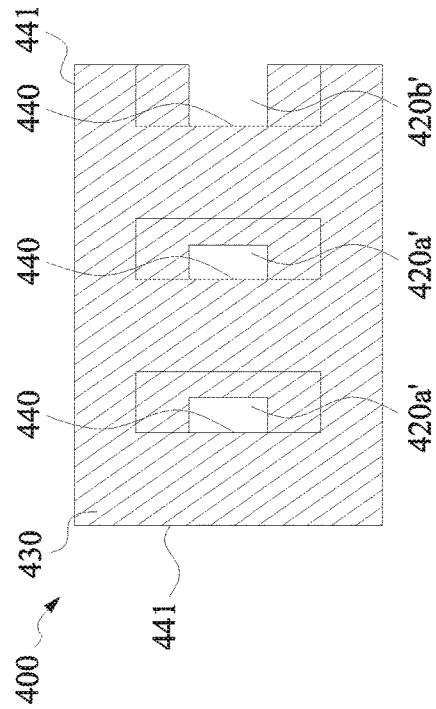
Fig. 21a   Fig. 21b   Fig. 21c   Fig. 21d

THREE-DIMENSIONAL TRANSISTOR AND METHODS OF MANUFACTURING THEREOF

PRIORITY CLAIM AND CROSS-REFERENCE

This patent application is a divisional of U.S. patent application Ser. No. 14/732,224, filed on Jun. 5, 2015 and entitled "Three-Dimensional Transistor and Methods of Manufacturing Thereof," which application is hereby incorporated by reference herein its entirety.

BACKGROUND

The present application relates to the field of three-dimensional (3D) transistors.

From the invention of the integrated circuit, it has been a goal to make the devices on the integrated circuit smaller and smaller. This provides greater functionality on each integrated circuit. However, with device dimensions reaching the scale of tens of nanometers and operational voltages dropping to tenths of a volt, traditional MOSFETs have reached some physical limits. Thus, other transistor types are being explored.

Traditional transistors are of planar type. Fin Field Effect Transistors (FinFET) are non-planar devices. However, as the device dimension continues to shrink, new structures for 3D transistors and methods for manufacturing the new devices are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1a and 1b illustrate a perspective view and a cross-sectional view, respectively, of a structure having a semiconductor fin extending from a substrate, in accordance with some embodiments.

FIGS. 2a and 2b illustrate some examples of forming semiconductor devices using a (001) wafer and a (110) wafer, respectively.

FIGS. 3a-11b illustrate different views (e.g., perspective view, top view, and cross-sectional view) of an inversion mode 3D transistor with vertically recessed channel region at various stages of fabrication, in accordance with some embodiments.

FIG. 12b illustrates TCAD simulation results for the 3D transistor shown in FIG. 12a.

FIGS. 13a-14b illustrate different views (e.g., perspective view, top view and cross-sectional view) of a junctionless mode 3D transistor with vertically recessed channel region at various stages of fabrication, in accordance with some embodiments.

FIG. 15b illustrates TCAD simulation results for the 3D transistor shown in FIG. 15a.

FIGS. 16a-20b illustrate another junctionless mode 3D transistor with vertically recessed channel region at various stages of fabrication, in accordance with some embodiments.

FIGS. 21a-21d illustrate top views of a 3D transistor with multiple fins at various stages of fabrication process, in accordance with some embodiments.

DETAILED DESCRIPTION

Figure 4A:
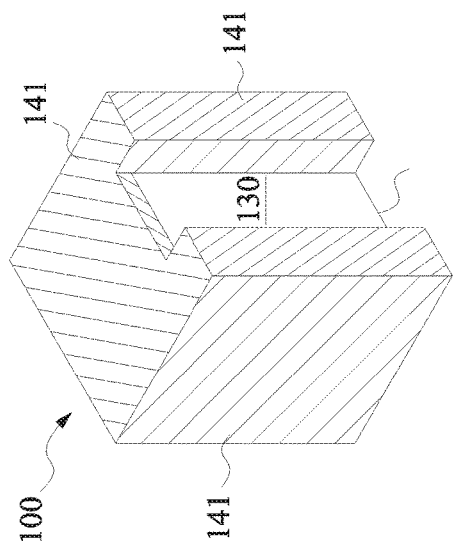

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

3-D transistors and methods of fabricating 3-D transistors are disclosed in the present disclosure. In some embodiments, a 3D transistor is fabricated from a semiconductor fin extending upward from a substrate. A vertically recessed channel region is formed by etching from a sidewall of the fin. A gate stack is formed over the vertically recessed channel region. The disclosed 3D transistor can be fabricated on different types of substrate such as bulk substrate, silicon-on-insulator (SOI) substrate or germanium-on-insulator (GeOI) substrate. In some embodiments, the source/drain (S/D) regions of the 3D transistor are formed before the vertically recessed channel is defined.

FIG. 1a illustrates a perspective view of a structure 100 with a semiconductor fin 130 extending upward from a substrate 110, in some embodiments. As illustrated in FIG. 1a, isolation region 120 is disposed over the substrate 110 and surrounds semiconductor fin 130. FIG. 1b illustrates a cross-sectional view of structure 100 along line B-B in FIG.

1a. Although only one fin 130 is illustrated in FIGS. 1a and 1b, skilled artisan will appreciate that two or more fins 130 could be formed on substrate 110.

Substrate 110 may comprise a bulk substrate comprising, e.g., bulk silicon. The substrate 110 may comprise various doped regions depending on design requirements (e.g., p-type substrate or n-type substrate). In some embodiments, the doped regions may be doped with p-type or n-type dopants. For example, the doped regions may be doped with p-type dopants, such as boron or BF2; n-type dopants, such as phosphorus or arsenic; and/or combinations thereof. The doped regions may be configured for an n-type transistor, or alternatively configured for a p-type transistor.

In some alternative embodiments, the substrate 110 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Further, the substrate 110 may include an epitaxial layer (epi-layer), may be strained for performance enhancement, and/or may include a SOI substrate or a GeOI substrate.

Semiconductor fin 130 may be formed by etching away a top portion of substrate 110 by, e.g., a photolithography and etching process. In some embodiments, fin 130 comprises a same material as substrate 110 or a top portion of substrate 110. In other embodiments, fin 130 may comprise a different material from substrate 110.

Isolation region 120 comprises dielectric material such as silicon oxide, although other dielectric materials, such as silicon nitride, silicon oxynitride, fluoride-doped silicate glass (FSG), or a low-K dielectric material, may also be used. In an embodiment, isolation region 120 may be formed using a high-density-plasma (HDP) CVD process, using silane (SiH4) and oxygen (O2) as reacting precursors. In other embodiment, isolation region 120 may be formed using a sub-atmospheric CVD (SACVD) process or high aspect-ratio process (HARP), wherein process gases may comprise tetraethylorthosilicate (TEOS) and ozone (O3). In yet other embodiment, isolation region 120 may be formed using a spin-on-dielectric (SOD) process.

In some embodiments, (001) wafers may be used to form fin 130 with (100) or (110) sidewalls, and (110) wafers may be used to form fin 130 with (100), (110) or (111) sidewalls, which sidewalls are etched to form vertically recessed channel region 150 as described hereafter (see FIGS. 5a-6b). FIGS. 2a and 2b illustrate some examples of forming semiconductor devices such as FinFET devices using a (001) wafer and a (110) wafer, respectively. In FIGS. 2a and 2b, the rays emanating from the center of the wafer illustrate different crystal plane directions with Miller indices shown next to the arrows of the rays. For example, in FIG. 2a, the ray pointing straight to the right side shows a crystal plane direction of [110], along which direction a semiconductor device such as a FinFET with direction (110)/[$\bar{1}$10] can be fabricated, where the notation (110)/[$\bar{1}$10] represents a current direction of (110) and a sidewall direction of [$\bar{1}$10], with the current direction being defined as a direction from the source region to the drain region along the channel region (e.g., a direction between line I-I in FIG. 7b).

FIGS. 3a-11b illustrate different views (e.g., perspective view, top view, and cross-sectional view) of an inversion mode 3D transistor 100 at various stages of fabrication, in accordance with some embodiments. The inversion mode here refers to the fact that an "inversion layer" or "channel" is formed between the source and drain region by a voltage applied between the gate electrode and the body of the transistor. For simplification, only the portion of fin 130 that extend above isolation region 120 is shown in subsequent figures in this disclosure. Other portions of structure 100, such as substrate 110 and isolation region 120 (see FIGS. 1a and 1b), may not be shown in subsequent figures, with the understanding that, although not shown, they are still part of structure 100.

Figure 3A:
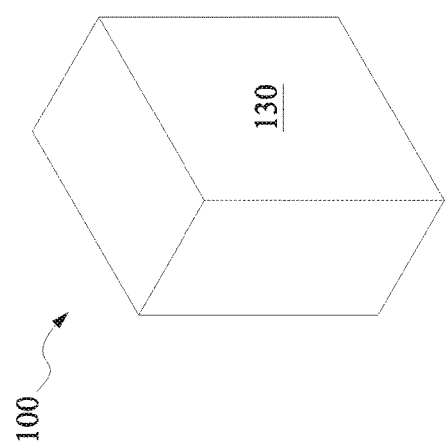
Figure 3B:
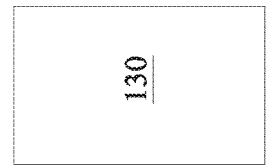

FIGS. 3a and 3b illustrate a perspective view and a top view of a semiconductor fin 130, respectively. Fin 130 comprises a lightly doped substrate such as an SOI substrate, a GeOI substrate, or a bulk substrate comprising, e.g., bulk silicon. The semiconductor fin 130 may comprise Ge, Si, a group III-V element, combinations thereof, or other suitable semiconductor materials, as examples. In some embodiments, the lightly doped substrate is doped with a p-type dopant, such as boron or BF2, with a concentration from about 1×1015 cm-3 to about 1×1018 cm-3, such as 1×1015 cm-3, although other p-type dopants with different concentrations might also be used. In other embodiments, the lightly doped substrate is doped with an n-type dopant, such as phosphorus or arsenic, with a concentration from about 1×1015 cm-3 to about 1×1018 cm-3, such as 1×1015 cm-3, although other n-type dopants with different concentrations might also be used. A substrate with p-type impurities may be used for fabricating an n-type transistor (e.g., nFET), and a substrate with n-type impurities may be used for fabricating a p-type transistor (e.g., pFET), as examples.

Figure 4B:
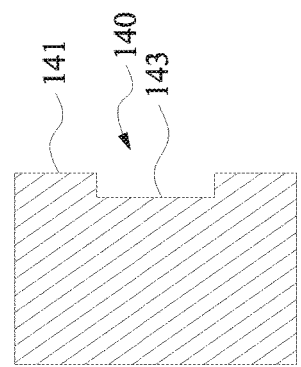

Next, as illustrated in FIG. 4a and a corresponding top view FIG. 4b, a photo resist (PR) or hard mask layer 141 is formed over fin 130, covering the top surface as well as three sidewalls of fin 130 and partially covering a fourth sidewall 143, where sidewall 143 has a desired crystal plane direction (e.g., (100), (110) or (111) direction) for forming a vertically recessed channel in subsequent processing. As illustrated in FIG. 4b, the PR or hard mask layer 141 covers two edge portions of sidewall 143 and form an opening 140 exposing a middle portion of sidewall 143.

The PR or hard mask layer 141 may be formed by any suitable deposition methods such as physical vapor deposition (PVD), chemical vapor deposition (CVD) or spin coating and patterned by, e.g., lithography and etching process. The PR or hard mask layer 141 may comprise a material (e.g., silicon oxide, silicon nitride, silicon oxynitride) with a different etch selectivity from the material of fin 130, so that in a subsequent etch process, the etchant removes a portion of fin 130 without substantially attacking the PR or hard mask layer 141.

Figure 5A:
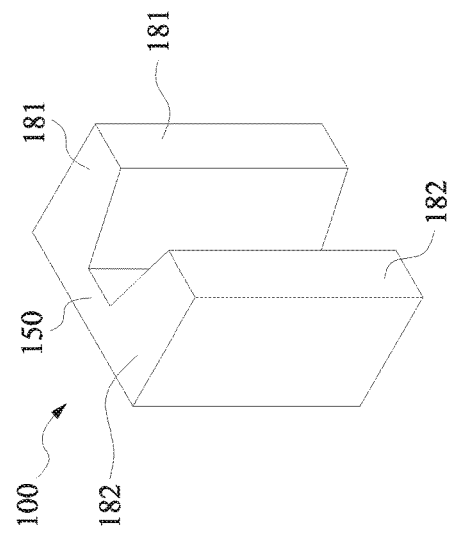
Figure 5B:
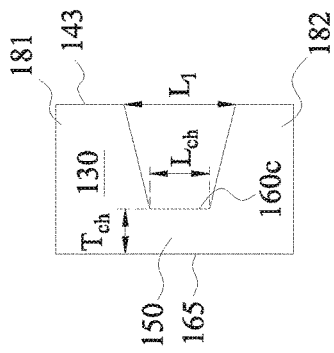

Referring to FIGS. 5a and 5b. An etch process is performed to remove a portion of fin 130 and form a vertical recess 160 in fin 130. In accordance with some embodiments, the etch process is a wet etch process. The etchant used in the wet etch process is potassium hydroxide (KOH) for fin 130 comprising Si, or H2O2 for fin 130 comprising Ge, as examples. The etchant etches crystalline materials at different rates along different crystal plane directions. For example, the etch rate of KOH for Si at (100) direction could be over 100 times more than the etch rate of Si at (111) direction. The differences in etch selectivity along different crystal planes could be utilized to achieve anisotropic etching, and recesses with high anisotropy could be formed by the wet etch process. In some embodiments, a vertical recess 160 with a trapezoidal cross-section, as shown in FIG. 5b, could be formed by etching from a sidewall with a properly chosen crystal plane direction.

As illustrated in FIG. 5b, vertical recess 160 starts from the exposed middle portion of sidewall 143 and extends into fin 130. In some embodiments, vertical recess 160 comprises two sidewalls 160a/160b and a bottom surface 160c, with the sidewalls 160a/160b and bottom surface 160c forming a substantially trapezoidal, V-shaped, or U-shaped recess. Vertical recess 160 tapers off as it extends into fin 130, with a width L1 at sidewall 143 and a width Lch at the bottom surface 160c (see FIG. 6b), where L1>Lch. A vertically recessed channel region 150 of fin 130 is formed between the recess bottom surface 160c and sidewall 165 of fin 130 (see FIG. 6b), where sidewall 165 is opposite to sidewall 143. The thickness of the vertically recessed channel region 150 is denoted by Tch in FIG. 6b. The vertically recessed channel region 150 comprises the channel region of semiconductor device 100, and the dimension Lch and Tch are hereafter referred to as the channel length and channel width for the vertically recessed channel 150, respectively. In accordance with some embodiments, Lch has a value in a range between about 5 nm and about 50 nm, and Tch has a value in a range from about 5 nm to about 30 nm.

Although vertical recesses 160 in FIGS. 5a and 5b are shown to have symmetric and straight sidewalls 160a/160b and flat bottom surface 160c, skilled artisan will appreciate that in real manufacturing process, the etch process may produce non-straight sidewalls 160a/160b and non-flat bottom surfaces 160c, and recess 160 may not have a perfect trapezoidal, V-shaped or U-shaped cross-section.

Figure 6A:
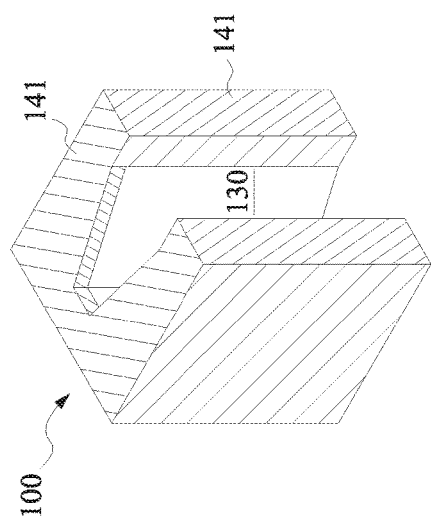
Figure 6B:
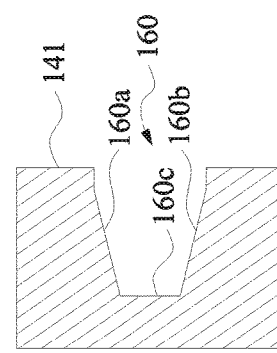

Next, as illustrated in FIGS. 6a and 6b, the PR or hard mask layer 141 is removed from fin 130 by an appropriate process, such as etching or ashing process. As illustrated in FIG. 6b, structure 100 now comprises a narrow region 150, and two enlarged regions 181/182 on both sides of narrow region 150. Regions 181/182 define the S/D regions of the 3D transistor 100, and narrow region 150 corresponds to the vertically recessed channel region, as will be discussed in more details in subsequent processing.

Referring to FIGS. 7a-7c. A dummy gate structure 170 is formed around the vertically recessed channel region 150 of fin 130, in some embodiments. Dummy gate structure 170 will be replaced by a replacement gate in subsequent processing. FIG. 7c shows the cross-sectional view of dummy gate structure 170 along a line C-C in the top view of FIG. 7b. As illustrated in FIG. 7c, dummy gate structure 170 may comprise dummy dielectric layer 171 and dummy gate layer 173 formed over the top surface 130T and two sidewalls 165 and 160c of the vertically recessed channel region 150. Dummy dielectric layer 171 comprises silicon oxide, silicon nitride, silicon carbon nitride, silicon oxynitride, silicon carbide, silicon oxycarbide, multilayers thereof, as examples. The formation methods of dummy dielectric layer 171 may include atomic layer deposition (ALD), CVD, plasma enhanced CVD (PECVD), a furnace deposition process, thermal oxidation, or the like. The dielectric layer 171 may be conformal to the shape of the underlying vertically recessed channel region 150 of fin 130 in some embodiments, as shown. The dummy gate layer 173 may comprise polysilicon or any acceptable sacrificial material. The dummy gate layer 173 may be deposited using CVD, ALD, PVD, the like, or a combination thereof. The dummy gate layer 173 may be conformal to the shape of the underlying dummy dielectric layer 171 in some embodiments.

Figure 8A:
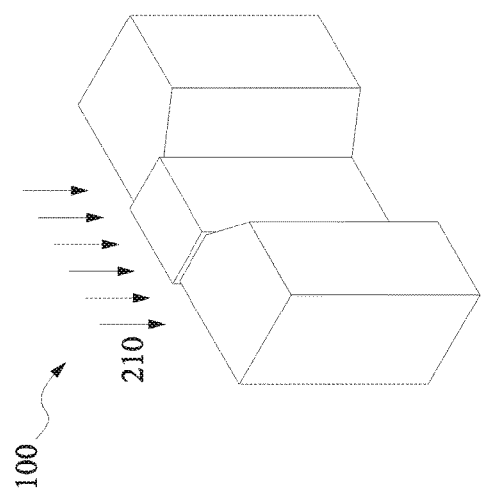
Figure 8B:
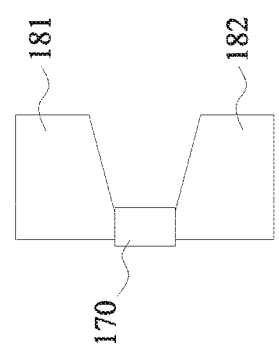

Next, as illustrated in FIGS. 8a and 8b, n-type or p-type impurities are formed in regions 181/182 to form S/D regions 181/182 of the inversion mode 3D transistor 100 by, e.g., an ion implantation process 210. An n-type impurity or dopant can be implanted in the regions 181/182 to form S/D regions 181/182 of an n-type transistor (e.g., nFET). Example species for implanting n-type dopants include arsenic (As), phosphorus (P), antimony (Sb), germanium (Ge), nitrogen (N), carbon (C), the like, or a combination thereof. A concentration of the n-type dopant in S/D regions 181/182 may be in a range from about $1\times1019$ cm-3 to about $1\times1021$ cm-3, such as $1\times1020$ cm-3. A p-type dopant can be implanted in the regions 181/182 to form S/D regions 181/182 for a p-type transistor (e.g., pFET). Example species for implanting p-type dopants include boron (B), BF2, indium (In), germanium (Ge), nitrogen (N), carbon (C), the like, or a combination thereof. A concentration of the p-type dopant in S/D regions 181/182 may be in a range from about $1\times1019$ cm-3 to about $1\times1021$ cm-3, such as $1\times1020$ cm-3. The dummy gate stack 170 shields the underlying channel region 150 so that the channel region 150 is not doped during the ion implantation process 210.

Figure 9A:
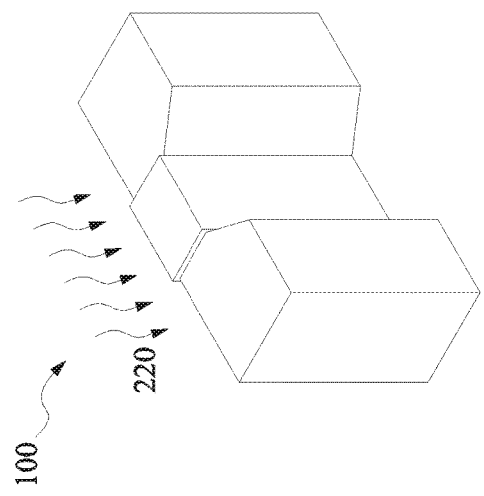
Figure 9B:
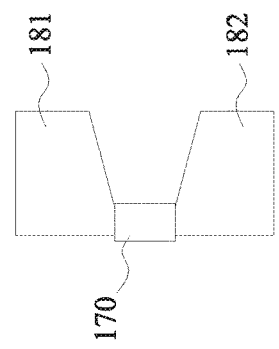

Next, as illustrated in FIGS. 9a and 9b, a thermal process 220 is performed to activate the dopant. In some embodiments, the dopant is activated by an in-situ annealing process 220 performed at a temperature range from about 500° C. to about 700° C. for a time period between about 30 seconds to about 180 seconds. In other embodiments, a rapid thermal annealing (RTA) process 220 may be performed at a temperature range from about 500° C. to about 700° C. for a time period between about 10 seconds to about 60 seconds. In yet another embodiment, a laser annealing process may be performed with a power density of the laser in a range from about 0.1 J/cm2 to about 1 J/cm2 and a laser pulse frequency in a range from about 10 MHz to about 500 MHz. The laser annealing process may use, e.g., a solid-state laser source and operate at near-instantaneous timeframes (e.g., microseconds) at temperatures up to about, e.g., 1400° C. At these temperatures, nearly full activation with minimal diffusion could be achieved in micro-seconds timeframe.

Figure 10A:
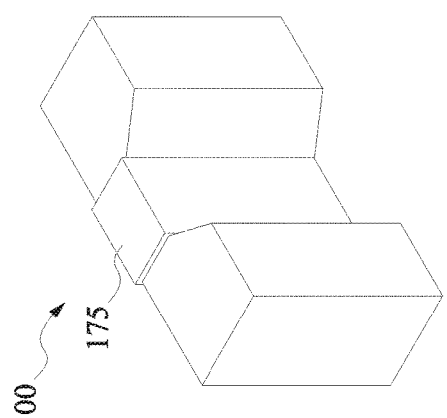
Figure 10C:
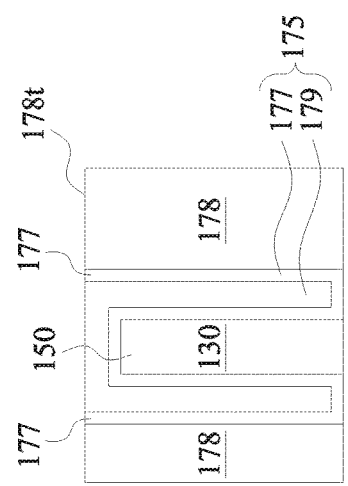
Figure 10B:
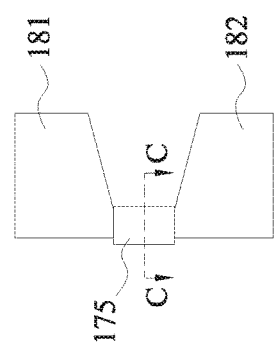

Next, dummy gate structure 170 is replaced by a replacement gate 175, as illustrated in FIGS. 10a-10c. FIG. 10c shows a cross-sectional view along line C-C of FIG. 10b. The replacement gate 175 may be a metal gate formed in a gate last process known in the art, for example. In some embodiments, the gate-last process comprises forming an inter-layer dielectric (ILD) layer surrounding the dummy gate structure 170, removing the dummy gate structure 170 to form a trench in the ILD layer, then filling the trench with dielectric layer and conductive gate electrode layer.

For example, an ILD layer 178 (not shown in FIGS. 10a and 10b for clarity, but shown in FIG. 10c) is formed surrounding the dummy gate structure 170. A chemical mechanical planarization (CMP) process may be performed to planarize the top surface 178t of the ILD layer 178. The dummy gate structure comprising dummy dielectric layer 171 and dummy gate layer 173 are removed in one or more etching step(s) (not shown), so that recess is formed in the ILD layer 178 exposing the channel region 150 of fin 130. Gate dielectric 177 is deposited conformally in the recess, such as on the top surface and sidewalls of the channel region 150 of fin 130 and on sidewalls of the ILD layer 178. In accordance with some embodiments, the gate dielectric 177 comprises silicon oxide, silicon nitride, or multilayers thereof. In other embodiments, the gate dielectric 177 comprises a high-k dielectric material, and in these embodiments, the gate dielectric 177 may have a k value greater than about 7.0, and may include a metal oxide or a silicate of Hf, Al, Zr, La, Mg, Ba, Ti, Pb, and combinations thereof, as examples. The formation methods of gate dielectric 177 may include molecular-beam deposition (MBD), ALD, PECVD, and the like, as examples. The gate dielectric 177 may also comprise other materials and may be formed using other methods.

Next, the gate electrode 179 is deposited over the gate dielectric 177 and substantially fills the remaining portions of the recess. The gate electrode 179 may comprise a metal-containing material such as Ti, N, TiN, TaN, TiC, TaC, Co, Ru, Al, W, TiSiN, TaAlC, TiAlC, a combination thereof, or multi-layers thereof, and may be deposited by PVD, CVD, ALD, the like, or a combination thereof. A liner, such as a diffusion barrier layer, an adhesion layer, or the like, may be formed between gate dielectric layer 177 and gate electrode 179 (not shown). The gate electrode 179 may also comprise other materials and may be formed using other methods.

After the filling of the gate electrode 179 material, a CMP process and/or etch process may be performed to remove excess portions of the gate dielectric 177 and the gate electrode 179 from over top surfaces of the ILD layer 178 and other surfaces of the semiconductor device 100, leaving the gate dielectric 177 and gate electrode 179 remaining in regions where the dummy gate structure was removed from, over the channel regions 150 of fins 130, as shown in FIGS. 10a-10c. The resulting remaining gate electrodes 179 and gate dielectrics 177 thus form replacement gate 175 of the semiconductor device 100.

Figure 11A:
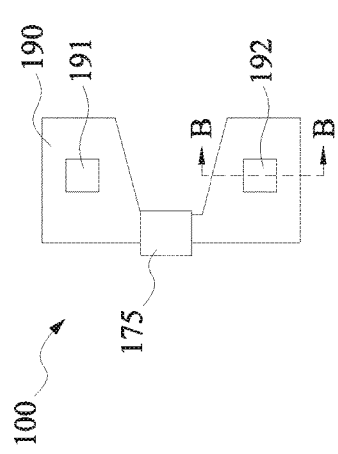
Figure 11B:
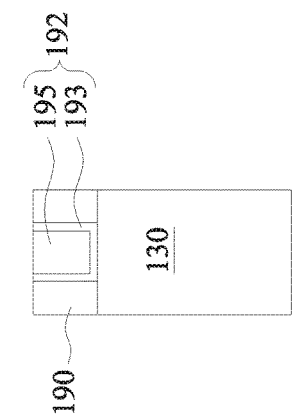

After forming the replacement gate 175, a dielectric layer such as an inter-layer dielectric (ILD) layer 190 is formed over the S/D regions 181/182, and S/D contacts 191/192 are formed therein, as shown in FIGS. 11a and 11b, where FIG. 11b shows a cross-sectional view along line B-B in FIG. 11a. ILD layer 190 may comprises one or more layers of dielectric material such as PSG, BSG, BPSG, USG, or the like, and may be deposited by any suitable method, such as CVD and PECVD. Openings for S/D contacts 191/192 are formed through the ILD layer 190 using, e.g., acceptable lithography and etching techniques. A liner 193, such as a diffusion barrier layer, an adhesion layer, or the like, and a conductive material 195 are formed in the openings by PVD, ALD, or other suitable methods. The liner 193 may include Ti, TiN, Ta, TaN, or the like. The conductive material 195 may be Cu, Ti, Ag, Au, W, Al, Ni, alloys thereof, or the like. The thickness of the deposited conductive material 195 is in a range from about 50 nm to about 200 nm, in accordance with some embodiments. A planarization process, such as a CMP, may be performed to remove excess material from a surface of the ILD layer 190. The remaining liner and conductive material form contacts 191/192 in the openings.

In other embodiments, conductive materials such as Ti, Ni, W, or the like are formed in the opening in ILD 190, and an anneal process is performed to form silicide or germanide. After the formation of silicide or germanide, liner layer and conductive material may be formed over the silicide or germanide to form S/D contacts 191/192, following similar processes as discussed above with reference to FIGS. 11a and 11b. In yet another embodiment, a metal-insulator-semiconductor (MIS) contact 191/192 is formed by forming a thin layer of dielectric tunneling material over S/D regions 181/182, then forming metal layers over the dielectric tunneling material. The thin dielectric tunneling material reduces Femi level pinning thus helps to reduce contact resistance. For example, $Si_3N_4$, AlOxISiOx, or LaOxISiOx may be used as the dielectric tunneling material for S/D regions comprising silicon; $Ge_3N_4$, SiOxNy, GeOx, AlOx, MgO and $TiO_2$ may be used as the dielectric tunneling material for S/D regions comprising germanium; and SiN, $Al_2O_3$, $HfO_2$, $TiO_2$, $ZrO_2$, $HfO_2|TiO_2$ may be used as the dielectric tunneling material for S/D regions comprising germanium-arsenide.

One skilled in the art will appreciate that other manufacturing processes may be needed following the process shown in FIGS. 11a and 11b to complete the fabrication of semiconductor device 100, such as forming inter-metal dielectric (IMD) layers, forming interconnect structures comprising metal lines and vias, forming passivation layer(s), and forming external connectors.

Figure 12B:
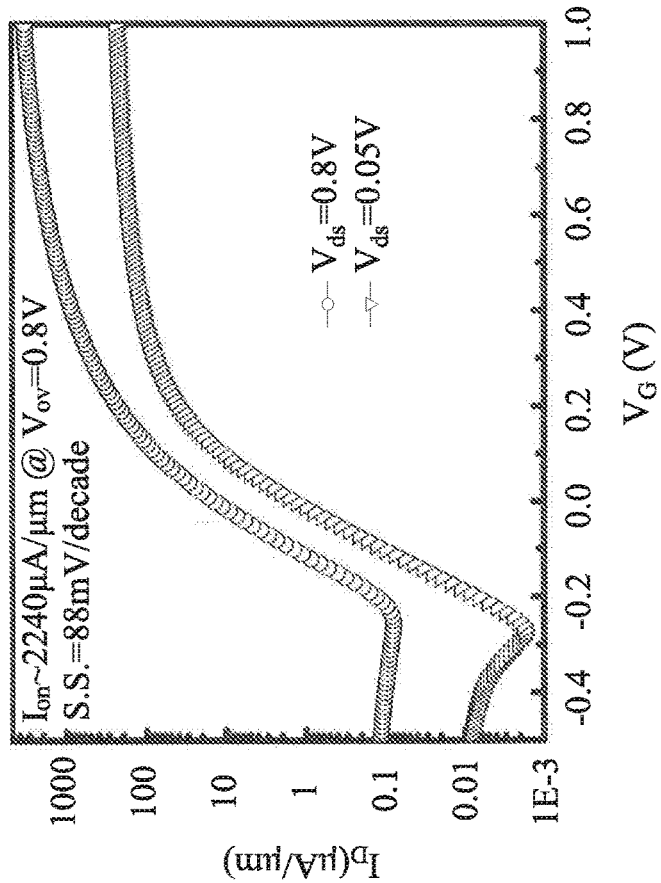
Figure 12A:
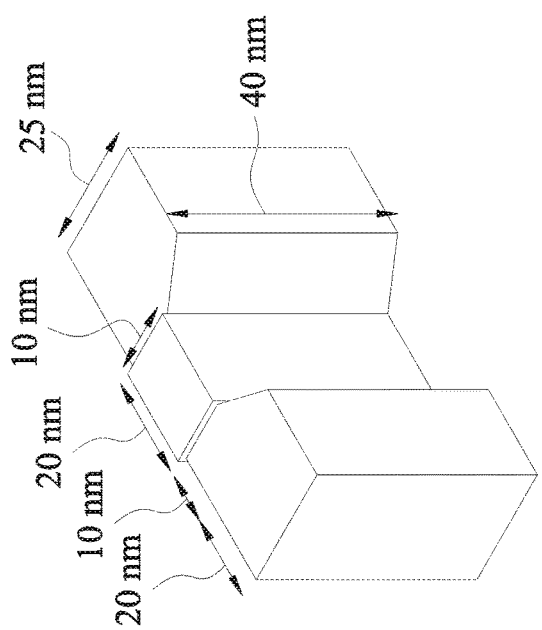
FIG. 12a illustrates an inversion mode 3D transistor with vertically recessed channel region used in Technology Computer Aided Design (TCAD) simulations.

Technology Computer Aided Design (TCAD) simulations are performed to show the performance of 3D transistor 100. FIG. 12a illustrates an inversion mode 3D transistor with vertically recessed channel similar to the one shown in FIGS. 11a and 11b, with the dimensions of the 3D transistor annotated in FIG. 12a. Other parameters used in the simulations include a doping concentration of $1 \times 10^{15}$ cm-3 for Boron in the channel region, a doping concentration of $1 \times 10^{20}$ cm-3 for phosphorus in the S/D region, and an effective oxide thickness (EOT) of 0.8 nm. FIG. 12b shows TCAD simulation results for two transfer curves illustrating the drain current (ID) versus gate-source voltage (VG) characteristics for the device shown in FIG. 12a. The two transfer curves correspond to a drain-source (VDS) voltage of 0.8 volt and 0.05 volt, respectively. As illustrated in FIG. 12b, a large on-current (Ion) of about 2240 µA/µm is achieve at an overdrive voltage (Vov=VG−Vt) of 0.8 volt, where Vt is the threshold voltage. A sub-threshold slope of 88 mV/decade is observed for the inversion mode 3D transistor.

Due to the vertically recessed channel 150 of semiconductor device 100, dimensions of the channel region (e.g., channel length Lch and channel width Tch) can be made small while the S/D regions 181/182 still have relatively large area. The large area of S/D regions 181/182 helps to reduce the contact resistance. As illustrated by the simulation results shown in FIG. 12b, large Ion current of about 2240 µA/µm is achieved without the need for raised epitaxial S/D regions formed over the S/D regions 181/182. Without the currently disclosed structures and methods, raised epitaxial S/D regions grown over the S/D regions 181/182 may be needed for reducing contact resistance. This illustrates some advantages of the present disclosure, such as simpler fabrication process (e.g., no need to grow raised epitaxial S/D region) and lower manufacturing cost. In addition, since raised epitaxial S/D regions require more space, the currently disclosed structures and methods are better for integration into integrated circuits (IC) chips with high component density.

FIGS. 13a-14b illustrate different views (e.g., perspective view, top view and cross-sectional view) of a junctionless mode 3D transistor 200 at various stages of fabrication, in accordance with some embodiments. The junctionless mode refers to the fact that the transistor 200 works as a junctionless transistor. For example, the source/drain regions and the channel region may comprise the same n-type or p-type dopant, and there is no P-N on N-P junctions between the source/drain regions and the channel region. In some embodiments, the junctionless device may be in the "ON" state when fabricated, and the gate of the transistor could be used to deplete the channel region thereby shutting off the device.

Fabrication of a junctionless mode 3D transistor 200 starts with a semiconductor fin 130 comprising a heavily doped epitaxial layer formed on a substrate such as a bulk substrate (e.g., bulk silicon), an SOI substrate, or a GeOI substrate, in some embodiments. The semiconductor fin 130 may comprise Ge, Si, a group III-V element, combinations thereof, or other suitable semiconductor materials, as examples. The epitaxial layer may comprise a N-type dopant, such as phosphorus or arsenic, or P-type dopant, such as boron or BF2, with a doping concentration in a range from about 1×1018 cm-3 to about 1×1020 cm-3, such as 1.2×1019 cm-3, as examples.

Next, semiconductor fin 130 is etched to form a vertical recess, which defines a vertically recessed channel region 150 and S/D regions 181/182 at both ends of the vertically recessed channel region 150, in some embodiments. The steps for forming vertically recessed channel 150 and S/D regions 181/182 are similar to the steps discussed above with reference to FIGS. 3a-6b, thus are not repeated here for brevity.

A gate stack 175 is next formed over the vertically recessed channel region 150 of fin 130, as illustrated in FIGS. 13a-13c. FIG. 13c shows a cross-sectional view along line C-C in FIG. 13b. The gate stack 175 is formed by conformally depositing a gate dielectric layer 177 over top surface and two sidewalls of channel region 150 and depositing a metal layer 179 over the gate dielectric layer 177, in some embodiments. A liner, such as a diffusion barrier layer, an adhesion layer, or the like, may be formed between gate dielectric layer 177 and gate electrode 179 (not shown). The materials and formation methods of the gate dielectric layer 177 and gate electrode 179 may be similar to those of gate dielectric layer 177 and gate electrode 179 of inversion mode 3D transistor 100, as described above with reference to FIGS. 10a-10c, thus not repeated here.

As illustrated in FIG. 13b, the gate stack 175 has a length L3 that is larger than the channel length Lch of the vertically recessed channel 150, although L3 may be substantially equal to Lch in other embodiments. For example, the gate stack 175 in FIG. 13b covers extension areas 183 of S/D regions 181/182. However, the channel length is only determined by Lch, which is determined by the etch process used to form the vertical recess 160. This illustrates another advantage of the present disclosure. In particular, the channel length Lch can be easily controlled by an etching process instead of a lithography process. As the size of semiconductor device continues to shrink, the margin of error allowed for lithography process gets smaller. Being able to control the channel length Lch using etching instead of lithography could mitigate the stringent requirements for the lithography process used in manufacturing.

After gate stack 175 is formed, S/D contacts 191/192 are formed over the S/D regions 181/182, as illustrated in FIGS. 14a and 14b. The materials and formation methods for S/D contacts 191/192 may be similar to those described above with reference to FIGS. 11a and 11b and not repeated here for brevity.

Device 200 illustrated in FIGS. 14a and 14b shows a junctionless mode 3D transistor 200. One skilled in the art will appreciate that more fabrication steps may be needed after the process shown in FIGS. 14a and 14b to complete fabrication of transistor 200.

Figure 15B:
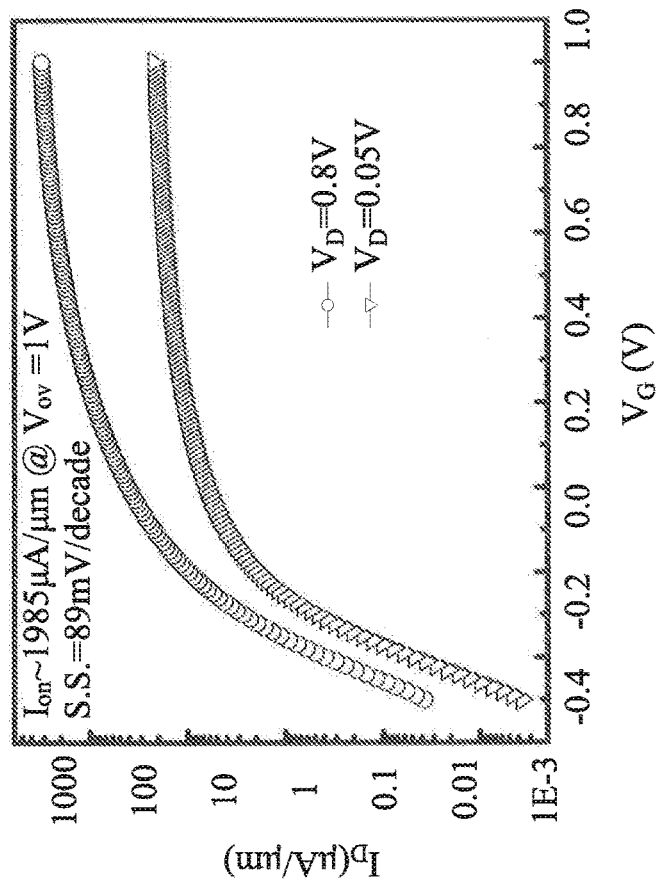
Figure 15A:
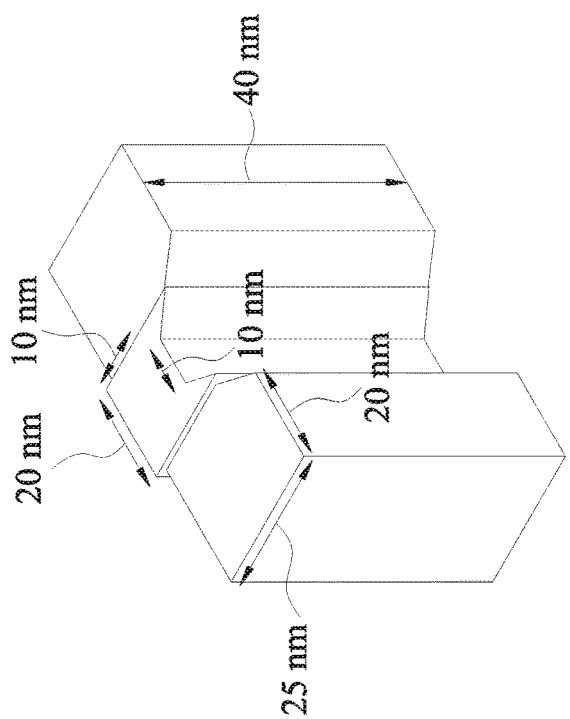
FIG. 15a illustrates a junctionless mode 3D transistor with vertically recessed channel region used in TCAD simulations.
Figure 20A:
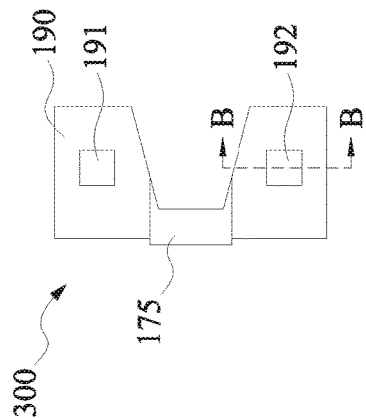
Figure 20B:
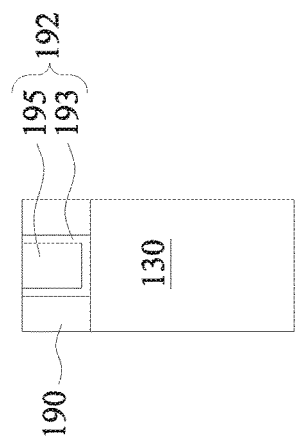
Figure 19A:
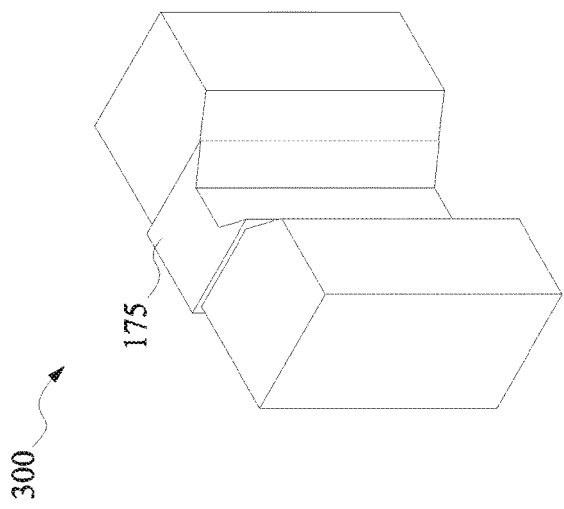
Figure 19B:
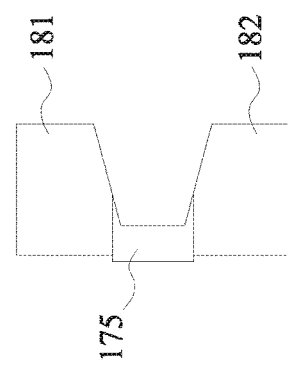

TCAD simulations are performed to show the performance of 3D transistor 200. FIG. 15a illustrates a junctionless mode 3D transistor with vertically recessed channel similar to the one shown in FIGS. 14a and 14b, with the dimensions of the transistor annotated in FIG. 15a. In the simulations, an N-type dopant with a concentration of 1.2× 1019 cm-3 is used for the heavily doped epitaxial layer. FIG. 15b shows TCAD simulation results for two transfer curves illustrating the drain current (ID) versus gate-source voltage (VG) characteristics for the device shown in FIG. 15a. The two transfer curves correspond to a drain-source (VDS) voltage of 0.8 volt and 0.05 volt, respectively. As illustrated in FIG. 15b, a large on-current (Ion) of about 1985 µA/µm is achieve at an overdrive voltage (Vov) of 1 volt. A sub-threshold slope of 89 mV/decade is observed for the junctionless mode 3D transistor.

FIGS. 16a-20b illustrate another junctionless mode 3D transistor 300 at various stages of fabrication process, in accordance with some embodiments. A semiconductor fin 130 comprising highly doped epitaxial layer is etched to form a structure 300 with a vertically recessed channel, following similar steps as described above with reference to FIGS. 3a-6b. A dummy gate structure 170 comprising dummy dielectric layer 171 and dummy gate layer 173 is formed over the channel region 150 of fin 130, as illustrated in FIGS. 16a-16c, wherein FIG. 16c is a cross-sectional view along line C-C of FIG. 16b. Details regarding the materials and formation methods of dummy gate structure 170 are similar to those discussed above with reference to FIGS. 7a-7c and not repeated here.

Next, as illustrated in FIGS. 17a and 17b, an ion implantation process 210 is performed to add impurities to the S/D regions 181 and 182. In accordance with some embodiments, the ion implantation process may advantageously reduce contact resistance of the S/D regions 181/182. An n-type impurity or dopant is implanted in S/D regions 181/182 for an n-type transistor (e.g., nFET). Example species for implanting n-type dopants include arsenic (As), phosphorus (P), antimony (Sb), germanium (Ge), nitrogen (N), carbon (C), the like, or a combination thereof. A concentration of an n-type dopant in S/D regions 181/182 can be in a range from about 1×1019 cm−3 to about 1×1021 cm−3. A p-type dopant can be implanted in S/D regions 181/182 for a p-type transistor (e.g., pFET). Example species for implanting p-type dopants include boron (B), BF2, indium (In), germanium (Ge), nitrogen (N), carbon (C), the like, or a combination thereof. A concentration of a p-type dopant in S/D regions 181/182 can be in a range from about 1×1019 cm−3 to about 1×1021 cm−3. The dummy gate structure 170 shields the underlying channel region 150 so that the channel region 150 is not doped during the implantation process 210.

Figure 18A:
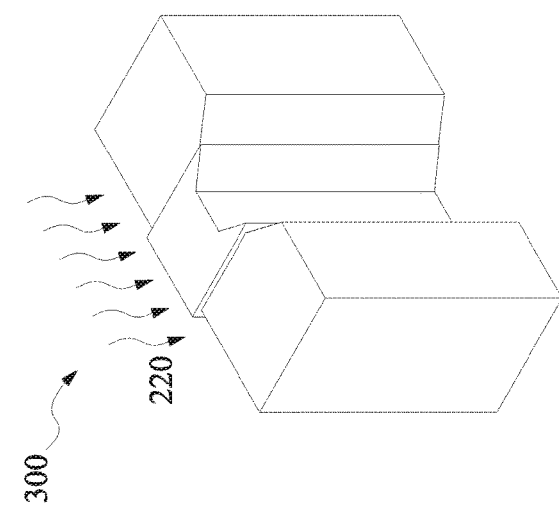
Figure 18B:
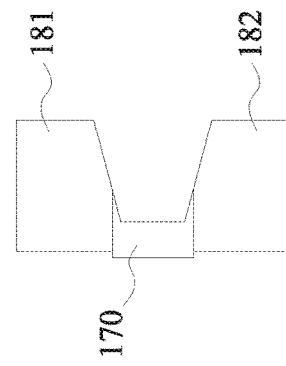

The dopant implanted is next activated by a thermal process 220, as illustrated in FIGS. 18a and 18b. The thermal process 220 might be an in-situ annealing process, a RTA process, or a laser annealing process, details of which are similar to those discussed above with reference to FIGS. 9a and 9b.

Next, the dummy gate structure 170 is replaced by a replacement gate 175, and S/D contacts 191/192 are formed over S/D regions 181/182, as illustrated in FIGS. 19a-20b, respectively. Details of the replacement gate process and S/D contact formation process are similar to those discussed above with reference to FIGS. 10a-11b.

FIGS. 21a-21d illustrate top views of a 3D transistor 400 with multiple fins (herein after multi-fin 3D transistor) in various stages of fabrication process, in accordance with some embodiments. Illustrated in FIG. 21a is a mesa 410 defined over a substrate (not shown). Mesa 410 may comprise a bulk substrate (e.g., bulk silicon), a SOI substrate, or a GeOI substrate, as examples. Mesa 410 may be surrounded by isolation region (not shown) comprising dielectric material such as silicon oxide, silicon nitride, silicon oxynitride, fluoride-doped silicate glass (FSG), or a low-K dielectric material formed using suitable deposition methods such as PVD, CVD, HDP CVD, as examples. Although not shown in FIG. 25a, mesa 410 rises above the underlying substrate and the surrounding isolation region and has a height H above the top surface of surrounding isolation region, in some embodiments. For example, semiconductor fin 130 illustrated in FIGS. 1a and 1b is a mesa.

Next, as illustrated in FIG. 21b, mesa 410 is patterned to form a plurality of vertical openings 420 (e.g., 420a and 420b) using, e.g., lithography and etch process. The vertical openings 420 may have a substantially same rectangular shape in a top view and are spaced apart at substantially equal distance, as illustrated in FIG. 21b. For example, each of the vertical openings 420 has a straight column shape with rectangular cross-section (e.g., cuboid) extending from a top surface of mesa 410 into the mesa. The depth of vertical openings 420 may be substantially equal to the height H of mesa 410, in some embodiments, although the depth of vertical openings 420 may also be different from the height H of mesa 410. As illustrated in FIG. 21b, each vertical opening 420a exposes four inner sidewalls 440 of mesa 410, while one vertical opening 420b has a right edge overlapping a right edge of mesa 410, thus exposing three inner sidewalls 440 of mesa 410 instead of four.

Next, a photo resist (PR) or hard mask layer 430 is formed over mesa 410 and patterned, as illustrated in FIG. 21c. A CMP process might be performed to planarize the PR or hard mask layer 430 before the patterning process. The patterning is performed using acceptable lithography and etching process, for example. In accordance with an embodiment, the PR or hard mask layer 430 is patterned by electron-beam lithography using He ion beam or Ne ion beam. After the patterning processing, PR or hard mask layer 430 covers external sidewalls 441 and top surface of mesa 410, and partially fills vertical openings 420, leaving only portions 420a'/420b' of vertical openings 420a/420b not covered by PR or hard mask layer 430. As illustrated in FIG. 21c, vertical openings 420a'/420b' have a straight column shape with rectangular cross-section (e.g., cuboid) and expose a middle portion of inner sidewalls 440 of mesa 410, which inner sidewalls 440 were previously exposed by vertical openings 420. Although the vertical opening 420b' shown in FIG. 21c is larger than other vertical openings 420a', the area of the exposed inner sidewall 440 in opening 420b' may remain substantially the same as the area of exposed inner sidewall 440 in other openings 420a'.

Next, an etch process similar to the one described above with reference to FIGS. 5a and 5b is performed to form a plurality of vertical recesses 460, and the PR or hard mask layer 430 is removed, as illustrated in FIG. 21d. Each vertical recess 460 is substantially trapezoidal, U-shaped or V-shaped in the top view of FIG. 21d, with the narrow ends of vertical recesses 460 defining a plurality of vertically recessed channel regions 450. The structure 400 shown in FIG. 21d may be used to form inversion mode or juntionless mode multi-fin 3D transistors, following processing steps similar to those described above with reference to FIGS. 3a-11b, FIGS. 13a-14b, and FIGS. 16a-20b, in some embodiments. The source regions or drain regions of the multi-fin device 400 formed using the method illustrated in FIGS. 21a-21d are continuous and naturally merge together, thus there is no need for additional processing steps to connect the sources regions or the drain regions together by, e.g., metal lines/vias or by growing epitaxial material over the S/D regions until the epitaxial material merge together. This illustrates another advantage of the present disclosure.

Figure 22A:
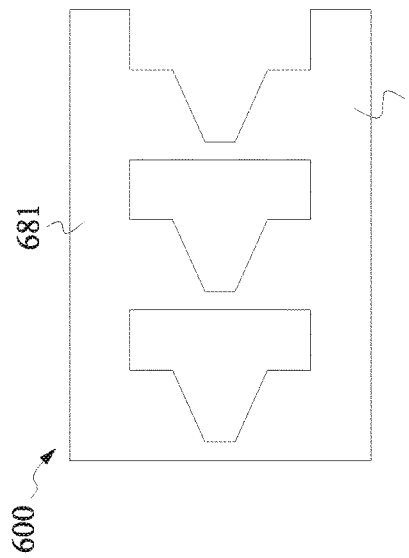
FIGS. 22a-23b illustrate a single fin 3D transistor and a multi-fin 3D transistor, respectively, with epitaxial source/drain regions at various stages of fabrication, in accordance with some embodiments.
Figure 22B:
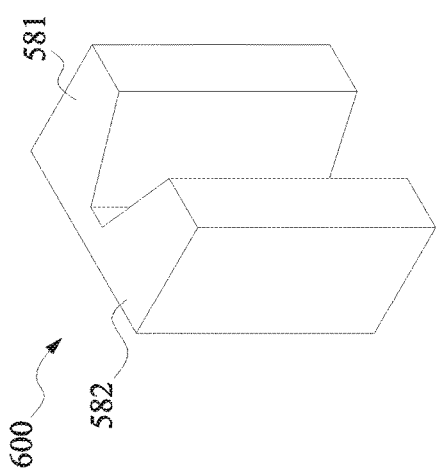

In some embodiments, S/D stressors can be added to advantageously improve the carrier mobility in the channel region, as illustrated in FIGS. 22a and 22b for a single fin 3D transistor 500. As illustrated in FIGS. 22a and 22b, top portions of S/D regions 581/582 of device 500 are etched away, and an epitaxial growth process is performed to grow epitaxial material on the remaining portions of S/D regions 581/582. The epitaxially grown S/D regions are denoted by 581'/582' in FIG. 22b. The carrier mobility of channel region 550 may be advantageously improved by the stress provided by the epitaxial S/D regions 581'/582', in some embodiments.

Figure 23A:
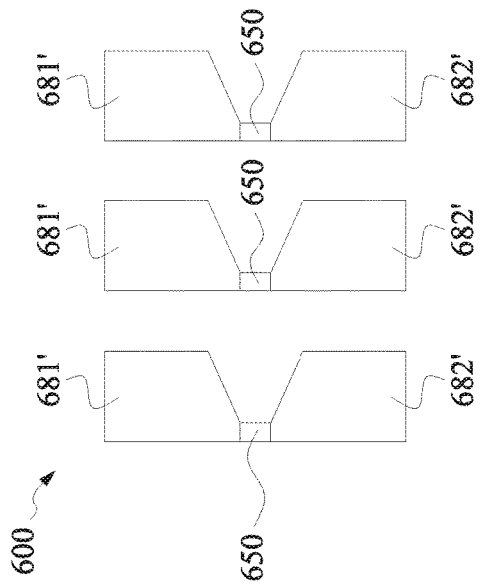
Figure 23B:
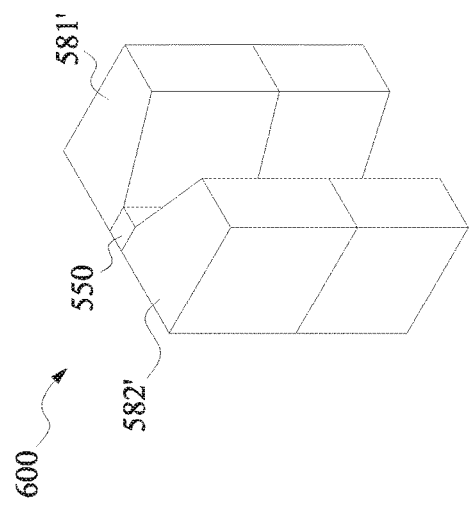

In another embodiment, S/D stressors may be added for a multi-fin 3D transistor 600, as illustrated in the top views of FIGS. 23a and 23b. In some embodiments, the top portions of S/D regions 681/682 are etched away and replaced by an epitaxial material 681'/682'. The epitaxial S/D regions 681'/682' may advantageously increase the carrier mobility in channel regions 650, in accordance with some embodiments. As illustrated in FIG. 23b, the epitaxial S/D regions 681'/682' are separate from each other, this might be achieved by first separating the continuous S/D regions 681/682 in FIG. 23a into multiple disconnected source regions and drain regions, before the etch and epitaxial growth process.

In some other embodiments, the separate epitaxial S/D regions 681'/682' formed in FIG. 23b may be connected together by growing the epitaxial material further until the epitaxial material of all source regions and all drain regions merge together and form a continuous source region and a continuous drain region, respectively (not shown).

In yet another embodiment, the merged S/D regions 681/682 in FIG. 23a are not separated before the etch process and epitaxial growth process. Instead, only some isolated areas in top portions of S/D region 681/682 (e.g., areas corresponding to locations of epitaxial regions 681'/682' in FIG. 23b) are etched away, while the remaining top portions of S/D regions 681 and 682 (e.g., top portions not etched away) still connect all source regions 681 together and all drain regions 682 together, respectively (not shown in FIGS. 23a and 23b). An epitaxial growth process is then performed to grow epitaxial material in the isolated areas that are etched away, with non-epitaxial S/D regions next to the epitaxial material. The epitaxial material provides stress to advantageously increase the carrier mobility in the channel, in some embodiments.

Due to the particular structures of the currently disclosed device (e.g., the vertically recessed channel region, and the S/D regions with a larger top surface area than the channel region), the regrown epitaxial S/D regions (e.g., epitaxial S/D regions 581'/582', 681'/682') may exhibit an asymmetry about the current direction, where the current direction is defined earlier with reference to FIG. 7b (e.g., along line I-I). For example, in a transmission electron microscopy (TEM) image showing regrown epitaxial S/D region in a plane perpendicular to the current direction, the left-hand side and right-hand side of the regrown epitaxial S/D region are not symmetric.

Figure 24:
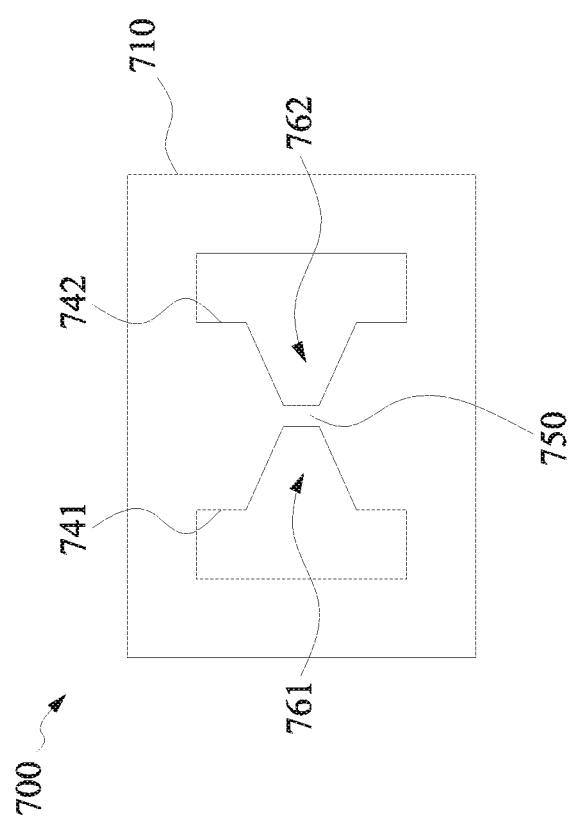
FIG. 24 illustrates a top view of a mesa with two vertical recesses formed substantially symmetrically with a shared channel region between the vertical recesses, in accordance with some embodiments.

FIG. 24 shows the top view of a mesa 710 with two vertical recesses 761 and 762 formed substantially symmetrically, with a shared vertically recessed channel region 750 between the bottoms of recesses 761 and 762. The vertically recessed channel 750 may be formed by etching from sidewalls 741 and 742 on both sides of the channel 750, following processing steps similar to those illustrated in FIGS. 3a-6b, for example. The device 700 comprising mesa 710 may be fabricated into an inversion mode or junctionless mode 3D transistor following the processing steps described above with reference to FIGS. 3a-11b, FIGS. 13a-14b, and FIGS. 16a-20b, in some embodiments.

Figure 25:
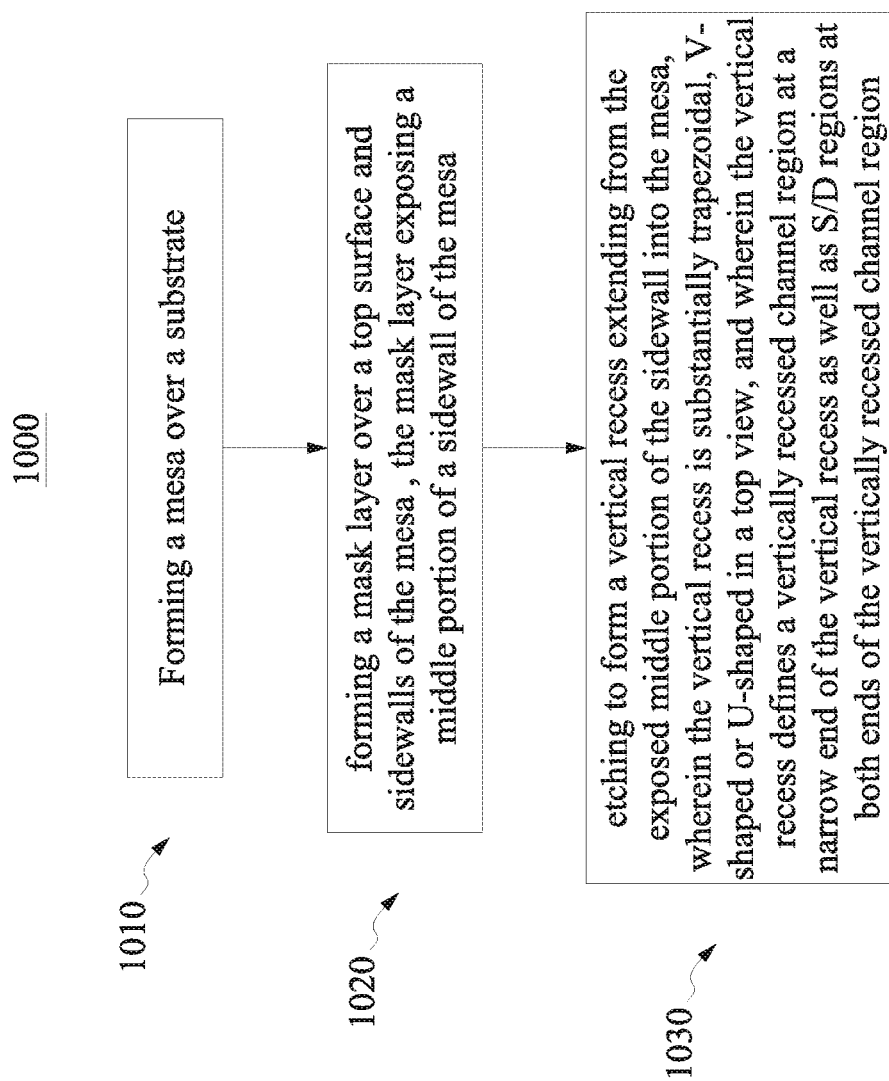
FIG. 25 illustrates a flow chart of a method for forming a 3D transistor with a vertically recessed channel, in accordance with various embodiments of the present disclosure.

FIG. 25 illustrates a flow chart of a method for forming a 3D transistor with a vertically recessed channel, in accordance with various embodiments of the present disclosure.

The flowchart shown in FIG. 25 is merely an example, which should not unduly limit the scope of the claims. One of ordinary skill in the art would recognize many variations, alternatives, and modifications. For example, various steps as illustrated in FIG. 25 may be added, removed, replaced, rearranged and repeated.

Referring to FIG. 25, at step 1010, a mesa is formed over a substrate. The mesa might be surrounded by isolation regions. At step 1020, a mask layer is formed over a top surface and sidewalls of the mesa. The mask layer exposes a middle portion of a sidewall of the mesa. At step 1030, etching is performed to form a vertical recess extending from the exposed middle portion of the sidewall into the mesa, wherein the vertical recess is substantially trapezoidal, V-shaped or U-shaped in a top view. The vertical recess defines a vertically recessed channel region at a narrow end of the vertical recess as well as S/D regions at both ends of the vertically recessed channel region.

Embodiments of the device and methods in the current disclosure have many advantages. For example, the 3D transistor with vertically recessed channel can be fabricated on a variety of different substrates such as a bulk substrate (e.g., bulk silicon), a GeOI substrate, and a SOI substrate. The vertically recessed channel enables better gate control from three sides of the channel region (e.g., top surface and two sidewalls), thus enabling a wider selection of substrates beyond GeOI or SOI substrates. As shown by TCAD simulations, large $I_{on}$ current can be achieved without the need to re-grow raised epitaxial S/D regions for the purpose of lowering contact resistance. Since re-grown raised epitaxial S/D regions take up more space, the current disclosed structures and methods not only save manufacturing cost, but also enable higher level of integration more easily. The channel length $L_{ch}$ of the vertically recessed channel is controlled by an etch process instead of lithography, thus small channel length (e.g. $L_{ch}$ of 10 nm) can be obtained without stringent requirements for lithography.

In some embodiments, a device comprises a first semiconductor fin extending over a substrate. The first semiconductor fin has a vertical recess extending from a first sidewall of the first semiconductor fin toward a second sidewall of the first semiconductor fin opposite the first sidewall. A distance between two opposing sidewalls of the vertical recess decreases as the vertical recess extends toward the second sidewall of the first semiconductor fin. The device further comprise a vertically recessed channel region between the second sidewall of the first semiconductor fin and a bottom of the vertical recess, source/drain (S/D) regions at opposite ends of the vertically recessed channel region, and a gate stack over the vertically recessed channel region.

In other embodiments, a structure comprises a mesa with a top surface extending away from a substrate, wherein the mesa has a first vertical opening that is substantially trapezoidal, V-shaped or U-shaped from a top view, with the first vertical opening extending from a first sidewall of the mesa to a second sidewall of the mesa opposite the first sidewall. A distance between two opposing sidewalls of the first vertical opening decreases along a first direction, with the first direction being perpendicular to the first sidewall and pointing from the first sidewall to the second sidewall. The structure also includes a first vertically recessed channel region at a narrow end of the vertical opening, a first source/drain (S/D) regions at opposite ends of the first vertically recessed channel region along a second direction, wherein the second direction is perpendicular to the first direction, and a gate stack over the vertically recessed channel region.

In yet another embodiment, a method of forming a device comprises forming a mesa over a substrate and forming a mask layer over a top surface and sidewalls of the mesa, the mask layer exposing a middle portion of a sidewall of the mesa. The method further comprises etching to form a vertical recess extending from the exposed middle portion of the sidewall into the mesa, wherein the vertical recess is substantially trapezoidal, V-shaped or U-shaped in a top view, and wherein the vertical recess defines a vertically recessed channel region at a narrow end of the vertical recess as well as S/D regions at both ends of the vertically recessed channel region.

In some embodiments, a method of forming a device includes forming a mesa over a substrate, forming a mask layer over a top surface and sidewalls of the mesa, the mask layer exposing a middle portion of a sidewall of the mesa, and etching to form a vertical recess extending from the exposed middle portion of the sidewall into the mesa. The vertical recess is substantially trapezoidal, V-shaped or U-shaped in a top view. The vertical recess defines a vertically recessed channel region at a narrow end of the vertical recess. The method further includes forming a gate stack over the vertically recessed channel region, and forming a source region and a drain region at a first end and a second end of the vertically recessed channel region, respectively, where a length of the gate stack measured along a first direction from the source region to the drain region is equal to or larger than a length of the narrow end of the vertical recess measured along the first direction.

In some embodiments, a method of forming a semiconductor device includes forming a semiconductor fin protruding above a substrate, and etching the semiconductor fin to form a vertical recess extending from a first sidewall of the semiconductor fin toward a second sidewall of the semiconductor fin opposite the first sidewall. A distance between two opposing sidewalls of the vertical recess decreases as the vertical recess extends toward the second sidewall of the semiconductor fin. The vertical recess defines a vertically recessed channel region between the second sidewall of the semiconductor fin and a bottom of the vertical recess, where the bottom is a third sidewall of the vertical recess opposite the first sidewall of the semiconductor fin. The method further includes forming a gate stack over the vertically recessed channel region, and implanting a first dopant in portions of the semiconductor fin disposed on opposing ends of the gate stack to form a source region and a drain region, respectively, where each of the source region and the drain region has a first part and a second part. The first part contacts the vertically recessed channel region and is disposed between the second part and the vertically recessed channel region. A first width of the first part measured along a first direction increases continuously as the first part extends away from the vertically recessed channel region, where the first direction is from the first sidewall of the semiconductor fin toward the second sidewall of the semiconductor fin.

In some embodiments, a method includes providing a substrate having a mesa, forming a first opening in the mesa, the first opening being surrounded by first inner sidewalls of the mesa exposed by the first opening. The method further includes etching from a first one of the first inner sidewalls of the mesa to form a first vertical recess, the first vertical recess having a wide end and a narrow end, with the narrow end defining a first vertically recessed channel region, and forming a first gate structure over the first vertically recessed channel region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a device, the method comprising:
    forming a mesa over a substrate;
    forming a mask layer over a top surface and sidewalls of the mesa, the mask layer exposing a middle portion of a sidewall of the mesa; and
    etching to form a vertical recess extending from the exposed middle portion of the sidewall into the mesa, wherein the vertical recess is substantially trapezoidal, V-shaped or U-shaped in a top view, wherein the vertical recess defines a vertically recessed channel region at a narrow end of the vertical recess;
    forming a gate stack over the vertically recessed channel region; and
    forming a source region and a drain region at a first end and a second end of the vertically recessed channel region, respectively, wherein a length of the gate stack measured along a first direction from the source region to the drain region is equal to or larger than a length of the narrow end of the vertical recess measured along the first direction.

2. The method of claim 1, wherein etching to form the vertical recess comprises performing a wet etch process.

3. The method of claim 2, wherein the wet etch process is an anisotropic etching process.

4. The method of claim 2, wherein the wet etch process uses an etchant comprising KOH or $H_2O_2$.

5. The method of claim 1, wherein the mesa is doped with an impurity.

6. The method of claim 5, wherein a concentration of the impurity is in a range from about $1\times10^{18}$ cm$^{-3}$ to about $1\times10^{20}$ cm$^{-3}$.

7. The method of claim 5, wherein the gate stack is a dummy gate structure, wherein the method further comprises:
    performing an implantation process to increase a concentration of the impurity in the source region and the drain region, wherein the dummy gate structure shields the vertically recessed channel region from the implantation process; and
    replacing the dummy gate structure with a replacement gate stack.

8. The method of claim 7, wherein the concentration of the impurity after the implantation process is in a range from about $1\times10^{19}$ cm$^{-3}$ to about $1\times10^{21}$ cm$^{-3}$.

9. The method of claim 7, further comprising performing a thermal anneal process after the implantation process.

10. The method of claim 1, wherein the gate stack is a dummy gate structure, wherein the method further comprises:
    implanting an impurity in the source region and the drain region using an implantation process, wherein the dummy gate structure shields the vertically recessed channel region from the implantation process;
    activating the implanted impurity; and
    replacing the dummy gate structure with a replacement gate stack.

11. The method of claim 1, further comprising forming source/drain contacts in the source region and the drain region.

12. A method of forming a semiconductor device comprising:
    forming a semiconductor fin protruding above a substrate;
    etching the semiconductor fin to form a vertical recess extending from a first sidewall of the semiconductor fin toward a second sidewall of the semiconductor fin opposite the first sidewall, wherein a distance between two opposing sidewalls of the vertical recess decreases as the vertical recess extends toward the second sidewall of the semiconductor fin, wherein the vertical recess defines a vertically recessed channel region between the second sidewall of the semiconductor fin and a bottom of the vertical recess, wherein the bottom is a third sidewall of the vertical recess opposite the first sidewall of the semiconductor fin;
    forming a gate stack over the vertically recessed channel region; and
    implanting a first dopant in portions of the semiconductor fin disposed on opposing ends of the gate stack to form a source region and a drain region, respectively, wherein each of the source region and the drain region has a first part and a second part, wherein the first part contacts the vertically recessed channel region and is disposed between the second part and the vertically recessed channel region, wherein a first width of the first part measured along a first direction increases continuously as the first part extends away from the vertically recessed channel region, wherein the first direction is from the first sidewall of the semiconductor fin toward the second sidewall of the semiconductor fin.

13. The method of claim 12, further comprising:
    performing a thermal process to active the first dopant; and
    replacing the gate stack with a replacement gate.

14. The method of claim 12, wherein the gate stack shields the vertically recessed channel region from the implanting of the first dopant.

15. The method of claim 12, further comprising doping the semiconductor fin with a second dopant before etching the semiconductor fin.

16. The method of claim 15, wherein the first dopant and the second dopant are of a same dopant type selected from the group consisting of N-type and P-type.

17. A method comprising:
    providing a substrate having a mesa;
    forming a first opening in the mesa, the first opening being surrounded by first inner sidewalls of the mesa exposed by the first opening;
    etching from a first one of the first inner sidewalls of the mesa to form a first vertical recess, the first vertical recess having a wide end and a narrow end, with the narrow end defining a first vertically recessed channel region; and
    forming a first gate structure over the first vertically recessed channel region.

18. The method of claim 17, further comprising forming first source/drain regions on opposite ends of the first gate structure.

19. The method of claim 17, further comprising:
forming a second opening in the mesa, the second opening being surrounded by second inner sidewalls of the mesa exposed by the second opening; and
etching from a first one of the second inner sidewalls of the mesa to form a second vertical recess, the second vertical recess having a wide end and a narrow end, with the narrow end defining a second vertically recessed channel region.

20. The method of claim 19, wherein the first vertical recess and the second vertical recess are formed to be symmetric in a top view, wherein the first vertically recessed channel region and the second vertically recessed channel region are a same vertically recessed channel region.

* * * * *